(12) United States Patent
Hu

(10) Patent No.: US 8,080,870 B2
(45) Date of Patent: Dec. 20, 2011

(54) DIE-WARPAGE COMPENSATION STRUCTURES FOR THINNED-DIE DEVICES, AND METHODS OF ASSEMBLING SAME

(75) Inventor: Chuan Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 230 days.

(21) Appl. No.: 12/456,638

(22) Filed: Jun. 18, 2009

(65) Prior Publication Data

US 2010/0320576 A1  Dec. 23, 2010

(51) Int. Cl.
  *H01L 23/34* (2006.01)
  *H01L 23/10* (2006.01)
(52) U.S. Cl. ........ 257/707; 257/E23.108; 257/706; 257/712; 257/720; 438/122; 438/125

(58) Field of Classification Search ........... 257/E23.123, 257/E21.214, 629, 678, 692, 706, 707, 712, 257/713, 734, 737, 738, 778, 790, E23.101, 257/E23.108, 720; 438/758, 122, 125
See application file for complete search history.

(56) References Cited

U.S. PATENT DOCUMENTS

| | | | | |
|---|---|---|---|---|
| 6,472,762 B1 * | 10/2002 | Kutlu | ............ | 257/778 |
| 6,683,386 B2 * | 1/2004 | Bai | ............ | 257/778 |
| 6,730,998 B1 * | 5/2004 | Williams et al. | ............ | 257/712 |
| 6,897,566 B2 * | 5/2005 | Su | ............ | 257/778 |
| 7,327,041 B2 * | 2/2008 | Dotta et al. | ............ | 257/783 |
| 7,449,780 B2 * | 11/2008 | Hua et al. | ............ | 257/762 |
| 2005/0090026 A1 * | 4/2005 | Otaki | ............ | 438/14 |

* cited by examiner

*Primary Examiner* — Chris Chu
(74) *Attorney, Agent, or Firm* — John N. Greaves

(57) ABSTRACT

A back-side lamination (BSL) is applied after thinning a microelectronic die. The BSL is configured to be a thermal-expansion complementary structure to a metal wiring interconnect layout that is disposed on the active side of the microelectronic die.

28 Claims, 7 Drawing Sheets

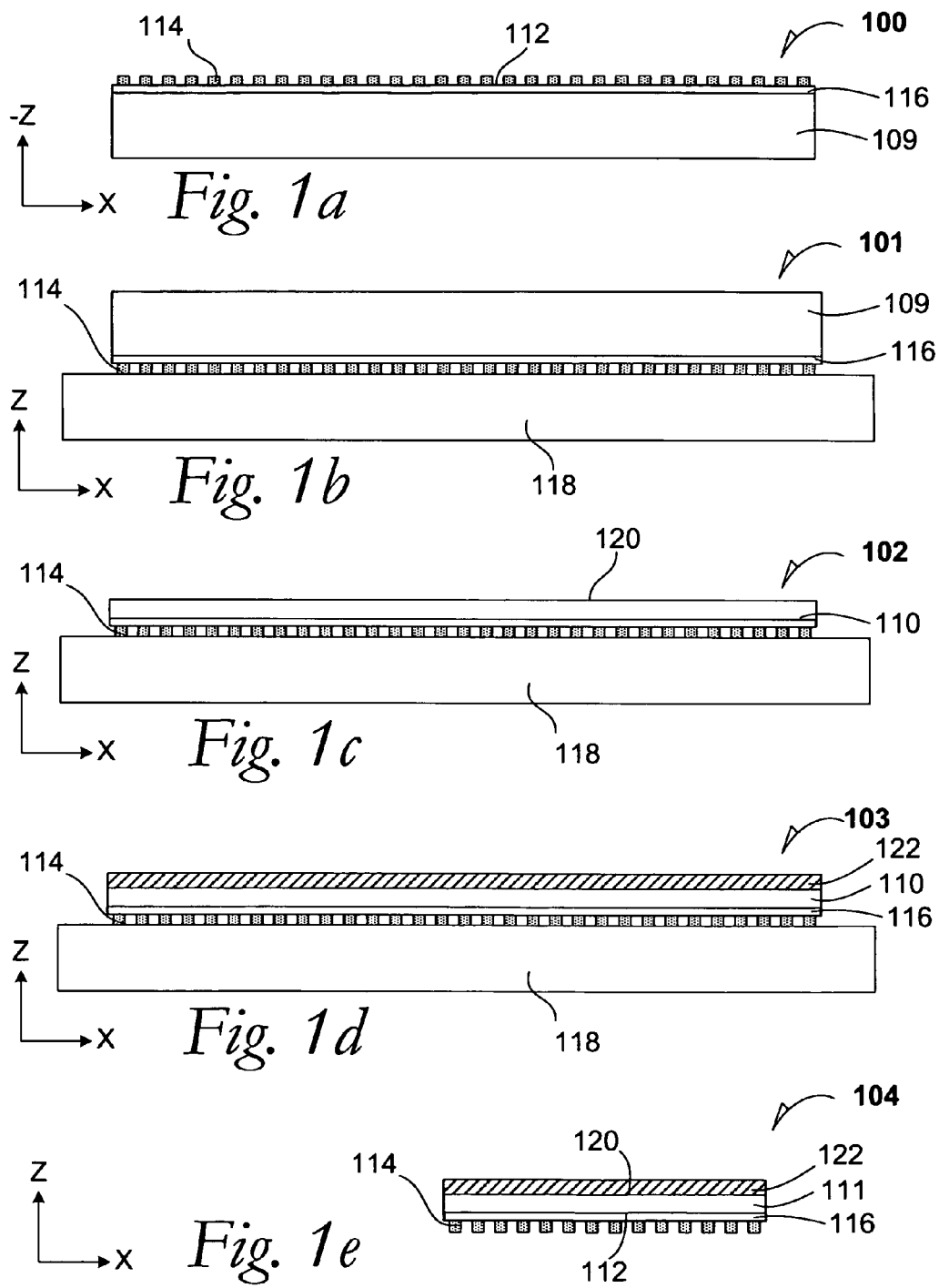

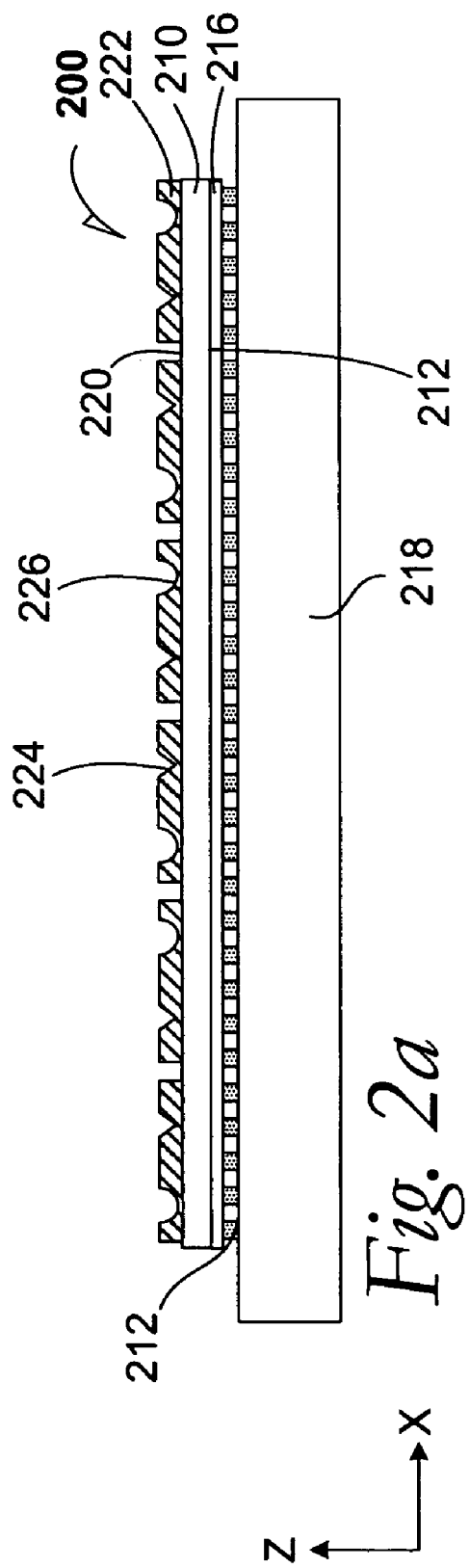
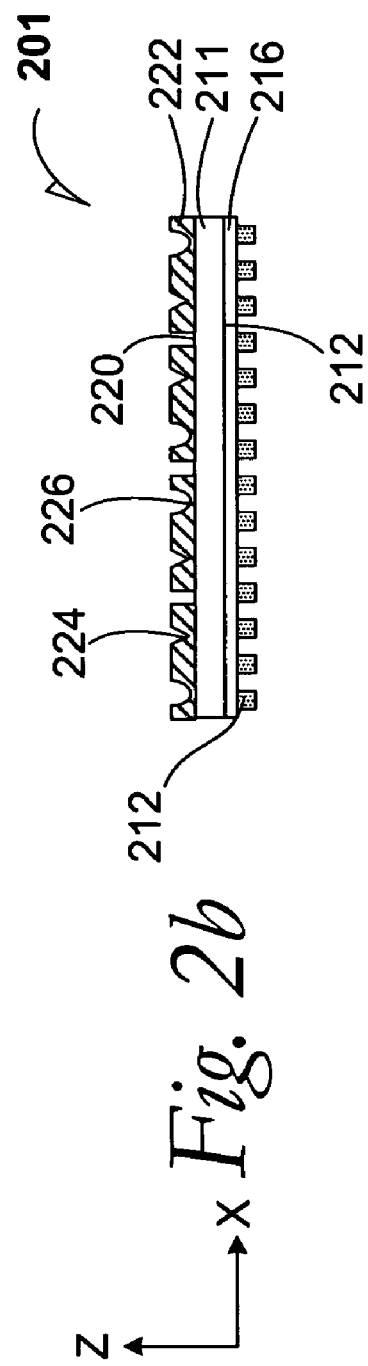

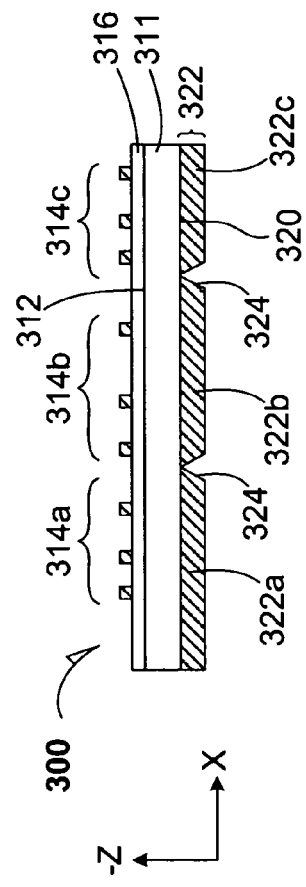
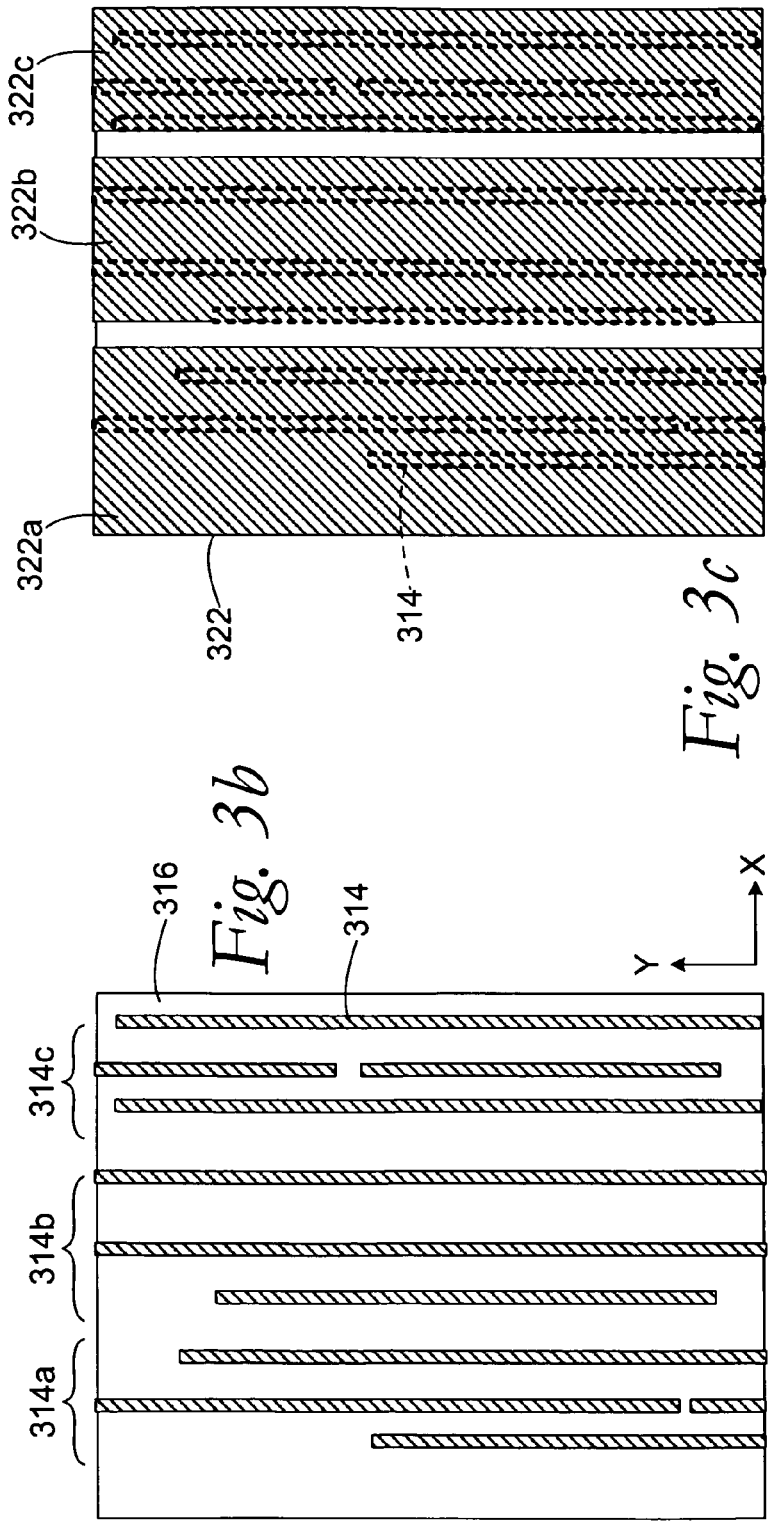

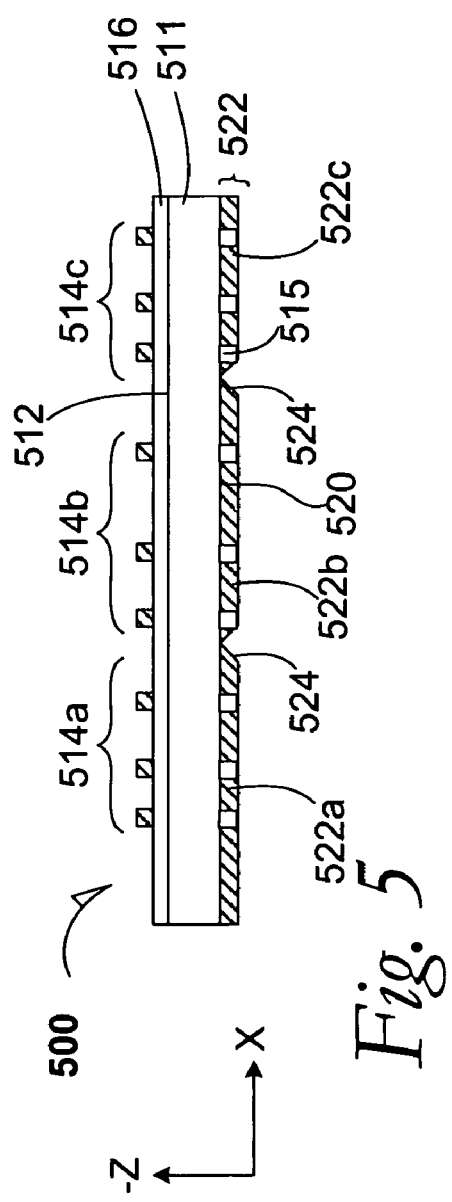
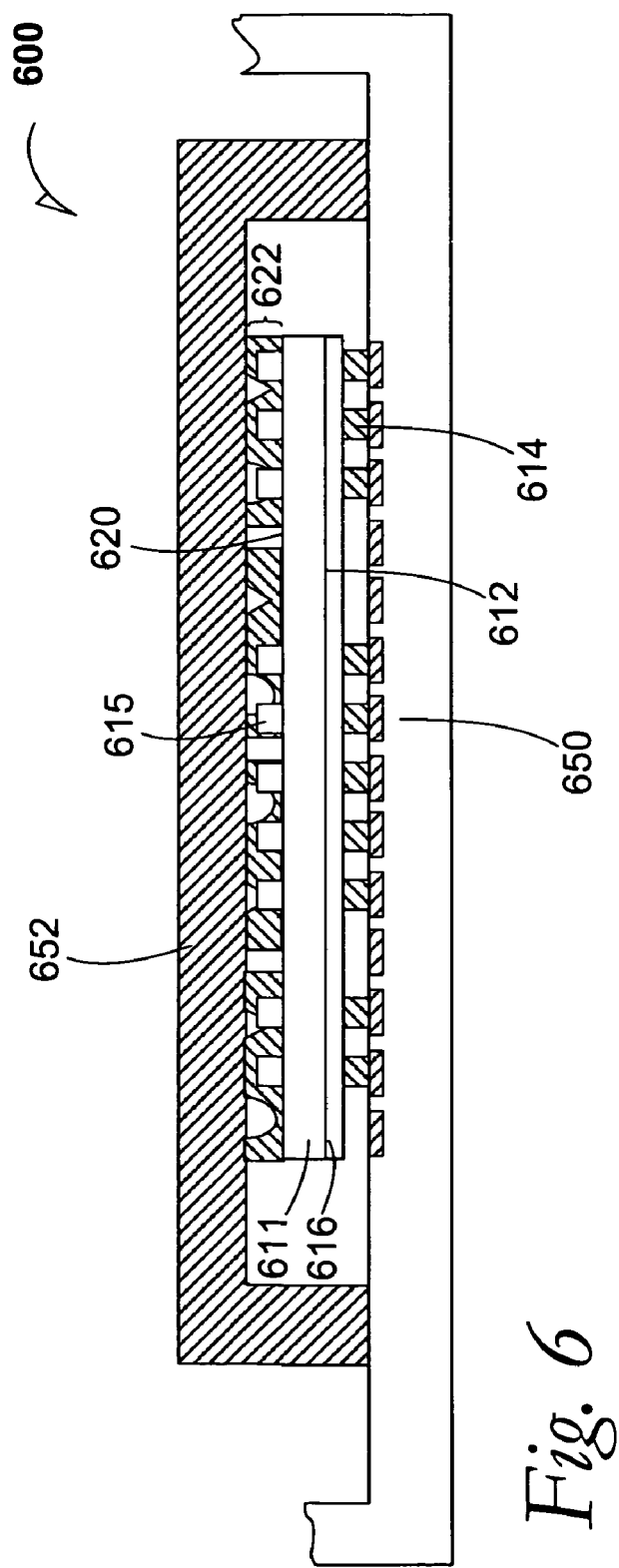

DIE-WARPAGE COMPENSATION STRUCTURES FOR THINNED-DIE DEVICES, AND METHODS OF ASSEMBLING SAME

TECHNICAL FIELD

Disclosed embodiments relate to semiconductor microelectronic devices and processes of packaging them.

BACKGROUND

As integrated circuit semiconductor technology continues to scale to smaller packages, die-warpage effects may become of greater significance.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1a is a cross-section elevation of a wafer structure during fabrication according to an example embodiment;

FIG. 1b is a cross-section elevation of the wafer structure depicted in FIG. 1a after further processing according to an example embodiment;

FIG. 1c is a cross-section elevation of the wafer structure depicted in FIG. 1b after further processing according to an example embodiment;

FIG. 1d is a cross-section elevation of the wafer structure depicted in FIG. 1c after further processing according to an example embodiment;

FIG. 1e is a cross-section elevation of a laminated microelectronic die that has been singulated from the wafer structure depicted in FIG. 1d according to an example embodiment;

FIG. 2a is a cross-section elevation of a wafer structure during processing according to an example embodiment;

FIG. 2b is a cross-section elevation of a laminated microelectronic die that has been singulated from the wafer structure depicted in FIG. 2a according to an example embodiment;

FIG. 3a is a cross-section elevation of a laminated microelectronic die that has been singulated from a wafer structure according to an example embodiment;

FIG. 3b is a top plan of the laminated microelectronic die depicted in FIG. 3a;

FIG. 3c is a bottom plan of the laminated microelectronic die depicted in FIG. 3a according to an embodiment;

FIG. 4b is a top plan of the laminated microelectronic die depicted in FIG. 4a;

FIG. 5 is a cross-section elevation of a laminated microelectronic die that has been singulated from a wafer structure according to an example embodiment;

FIG. 6 is a cross-section elevation of a computing device according to an embodiment;

DETAILED DESCRIPTION

Figure 4A:
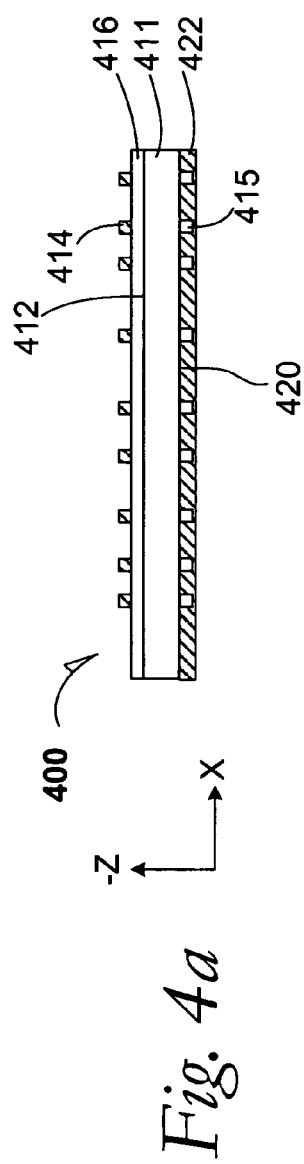
FIG. 4a is a cross-section elevation of a laminated microelectronic die that has been singulated from a wafer structure according to an example embodiment.

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may only show the structures necessary to understand the illustrated embodiments. Additional structures known in the art may not have been included to maintain the clarity of the drawings. Although a processor chip and a memory chip may be mentioned in the same sentence, it should not be construed that they are equivalent structures.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" may be understood by reference to the X-Z coordinates, and terms such as "adjacent" may be understood by reference to the illustrated X-Y coordinates.

FIG. 1a is a cross-section elevation of a wafer structure 100 during fabrication according to an example embodiment. The wafer structure 100 includes a microelectronic wafer 109. The wafer 109 has been processed with active devices upon the active surface 112. A metal wiring interconnect layout 114 is disposed above an active surface 112 and is configured to make electrical-communication contact therewith. The metal wiring interconnect layout 114 is also referred to as a thick-metal (TM) interconnect layout 114. The "TM" reference is to a thickness from 5 micrometer (μm) to 9 μm according to selected embodiments.

In an embodiment, the active surface 112 and the metal wiring interconnect layout 114 are electrically coupled through a series of metallization layers 116. The series of metallization layers 116 may also be referred to as a front-side metallization 116. For example, the series of metallization layers 116 includes up to eight metallization layers that may be referred to seriatim as metal-1 (M1) through M8.

In an embodiment where device density allows, the wafer structure 100 includes the wafer 109 and the metal wiring interconnect layout 114 with no additional metallization layers 116. In an embodiment where device density allows, the wafer structure 100 includes the wafer 109, a single metallization layer 116, and the metal wiring interconnect layout 114. In this embodiment, the device density is denser than with no metallization layer 116 present. In an embodiment, two metallization layers, M1 and M2 are part of the series of metallization layers 116 along with the metal wiring interconnect layout 114. In an embodiment, three metallization layers M1, M2, and M3 are part of the series of metallization layers 116 along with the metal wiring interconnect layout 114. In an embodiment, four metallization layers M1, M2, M3, and M4 are part of the series of metallization layers 116 along with the metal wiring interconnect layout 114. In an embodiment, five metallization layers M1, M2, M3, M4, and M5 are part of the series of metallization layers 116 along with the metal wiring interconnect layout 114. In an embodiment, six metallization layers M1, M2, M3, M4, M5, and M6 are part of the series of metallization layers 116 along with the metal wiring interconnect layout 114. In an embodiment, seven metallization layers M1, M2, M3, M4, M5, M6, and M7 are part of the series of metallization layers 116 along with the metal wiring interconnect layout 114. In an embodiment, the metal wiring interconnect layout 114 is thicker than all of the series of metallization layers 116, whether it is M1 alone or a series that ends in M8.

FIG. 1b is a cross-section elevation of the wafer structure depicted in FIG. 1a after further processing according to an example embodiment. The wafer structure 101 has been inverted with respect to the Z-axis and a grinding tape 118 has been applied to the metal wiring interconnect layout 114 in preparation for wafer thinning.

FIG. 1c is a cross-section elevation of the wafer structure depicted in FIG. 1b after further processing according to an example embodiment. The wafer structure 102 illustrates a thinned wafer 111 that has been thinned by a process such as backgrinding. In an embodiment, the thinned wafer 110 has a thickness from 50 micrometer ($\mu m$) to 400 $\mu m$. The thinned wafer 110 exhibits a thinned backside 120.

FIG. 1d is a cross-section elevation of the wafer structure depicted in FIG. 1c after further processing according to an example embodiment. The wafer structure 103 illustrates the thinned wafer 110 with a back-side lamination (BSL) 122 disposed on the thinned backside 120.

In a non-limiting example embodiment, process the BSL 122 BSL at room temperature by use of ultraviolet (UV) light. In a non-limiting example embodiment, the BSL 122 is cured under refrigeration conditions (meaning below room temperature) or slightly elevated temperature on a hot plate by use of UV light. One example embodiment material of the BSL includes polyimide material with curing agents that are UV reactive.

FIG. 1e is a cross-section elevation of a laminated microelectronic die 104 that has been singulated from the wafer structure 103 depicted in FIG. 1d according to an example embodiment. A microelectronic die 111 has been singulated from the thinned wafer 110 depicted in FIG. 1d. The active surface 112 and the metal wiring interconnect layout 114 are electrically coupled through the series of metallization layers 116 according to the several disclosed embodiments, including no metallization layer except the metal wiring interconnect layout 114.

In an embodiment, the BSL 122 as applied causes the microelectronic die 111 to resist warpage to less than 5 $\mu m$. For example, where the microelectronic die 111 is 50 $\mu m$ thick and 1 cm by 1 cm wide, warpage from the center of die 111 to the corner is less than 5 $\mu m$. In another embodiment, the BSL 122 applied causes die 111 to resist warpage to less than 50 $\mu m$. Without BSL 122, the warpage could be from 50 to 400 $\mu m$.

In an embodiment, where the microelectronic die 111 has a first thickness in a range from 50 $\mu m$ to 400 $\mu m$, the BSL 122 has a second thickness from 4 $\mu m$ to 50 $\mu m$. In an embodiment, the microelectronic die 111 has a first thickness in a of 400 $\mu m$ and the BSL 122 has a second thickness of 50 $\mu m$. In an embodiment, the microelectronic die 111 has a first thickness in a of 50 $\mu m$ and the BSL 122 has a second thickness in a range from 4 $\mu m$ to less than 50 $\mu m$ such as 49 $\mu m$. In an embodiment, the microelectronic die 111 has a first thickness in a of 50 $\mu m$ and the BSL 122 has a second thickness of 4 $\mu m$.

In an embodiment, the BSL has the rigidity equivalent of aluminum metal with a thickness of 10 $\mu m$ such that during intended usage of the microelectronic die 111 heat generation therein is transferred to the metal wiring interconnect layout 114, and thermal expansion of the metal wiring interconnect layout 114 is countered by the presence of the BSL 122 such that warpage of the microelectronic die 111 is less than 10 $\mu m$.

In any event, during intended usage of the microelectronic die 111 heat generation therein is transferred to the metal wiring interconnect layout 114, and thermal expansion of the metal wiring interconnect layout 114 is countered by the presence of the BSL 122 such that warpage of the microelectronic die 111 is less than 10 $\mu m$.

As a result of the disclosed embodiments and especially at the solder reflow temperature needed during processing, higher yields and non-connect opens are reduced. Consequently, chip joining is improved by reducing non-contact bumps.

FIG. 2a is a cross-section elevation of a wafer structure 200 during processing according to an example embodiment. The wafer structure 200 includes a thinned wafer 210, a front-side metallization 216, and a metal wiring interconnect layer 214 according to the several disclosed embodiments depicted in FIGS. 1a-1e. A grinding tape 218 has been applied to the metal wiring interconnect layout 214 to achieve the thinned wafer 210. In an embodiment, the thinned wafer 210 has a thickness from 50 $\mu m$ to 400 $\mu m$.

A patterned BSL 222 is disposed on the thinned backside 220. In an embodiment, the patterned BSL 222 is patterned to leave exposed portions of a thinned backside 220. As illustrated, the patterned BSL 222 is patterned both to leave exposed portions of the thinned backside 220 as well as a conical-shaped depression 224 that selectively thins the patterned BSL 222. The conical-shaped depression 224 appears as a furrow when observed in plan view. The conical-shaped depression 224 may be positioned between individual structures of the metal wiring interconnect layout 214. In an embodiment, the conical-shaped depression 224 removes an amount of material from the patterned BSL 222 such that thermal expansion of the patterned BSL 222 counteracts thermal expansion of the As illustrated, the patterned BSL 222 is patterned both to leave exposed portions of the thinned backside 220 as well as a curve-shaped depression 226 that selectively thins the patterned BSL 222. The curve-shaped depression 226 appears as a furrow when observed in plan view. The conical-shaped depression 224 may be positioned between individual structures of the metal wiring interconnect layout 214.

FIG. 2b is a cross-section elevation of a laminated microelectronic die apparatus 201 that has been singulated from the wafer structure 200 depicted in FIG. 2a according to an example embodiment. The wafer structure 201 has been processed such that a microelectronic die 211 has been extracted from the thinned wafer 210 depicted in FIG. 2a. The microelectronic die 211 has a first thickness and the patterned BSL 222 has a second thickness. The second thickness is less than the first thickness according to any disclosed embodiments set forth and illustrated with respect to FIGS. 1a-1e. The active surface 212 and the metal wiring interconnect layout 214 are electrically coupled through the series of metallization layers 216 according to the several disclosed embodiments, including no metallization layer except the metal wiring interconnect layout 214.

In an embodiment, the patterned BSL 222 has the rigidity equivalent of aluminum metal with a thickness of 10 $\mu m$ such that during intended usage of the microelectronic die 211 heat generation therein is transferred to the metal wiring interconnect layout 214, and thermal expansion of the metal wiring interconnect layout 114 is countered by the presence of the patterned BSL 222 such that warpage of the microelectronic die 211 is less than 10 μm.

In any event, during intended usage of the microelectronic die 211 heat generation therein is transferred to the metal wiring interconnect layout 214, and thermal expansion of the metal wiring interconnect layout 214 is countered by the presence of the patterned BSL 222 such that warpage of the microelectronic die 211 is less than 10 μm.

FIG. 3a is a cross-section elevation of a laminated microelectronic die apparatus 300 that has been singulated from a wafer structure according to an example embodiment. The laminated microelectronic die apparatus 300 includes a thinned die 311. In an embodiment, the thinned die 311 has a thickness from 50 μm to 400 μm. The thinned die 311 includes a front-side metallization 316 and a metal wiring interconnect layer 314 according to the several disclosed embodiments depicted in FIGS. 1a-1e. The metal wiring interconnect layer 314 is depicted as a first layout sector 314a, a second layout sector 314b, and a third layout sector 314c.

A patterned BSL 322 is disposed on the thinned backside 320. In an embodiment, the patterned BSL 322 is patterned as a first patterned sector 322a, a second patterned sector 322b, and a third patterned sector 322c, which correspond to the first- second- and third layout sectors 314a, 314b, and 314c, respectively.

As illustrated, the patterned BSL 322 is patterned with conical-shaped depressions 324 that result in sectors. The conical-shaped depressions 324 appear as furrows when observed in plan view. As illustrated, the conical-shaped depressions 324 are positioned to vertically corresponding with respective layout sectors of the metal wiring interconnect layout 314. In an embodiment, the conical-shaped depressions 324 remove an amount of material from the patterned BSL 322. Thermal expansion of the patterned BSL 322, for example the second patterned sector 322b, counteracts thermal expansion of the second layout sector 314b.

In an embodiment, the patterned BSL 322 may be patterned with curve-shaped depressions such as seen in FIG. 2b. The curve-shaped depressions appear as furrows when observed in plan view.

FIG. 3b is a top plan of the laminated microelectronic die 300 depicted in FIG. 3a. The metallization structure 316 is depicted with the metal wiring interconnect layout 314 disposed thereupon. In an embodiment, however, the metallization structure 316 may not be present and the metal wiring interconnect layout 314 is disposed directly upon the active surface 312.

The metal wiring interconnect layout 314 may also be further defined in three sectors 314a, 314b, and 314c according to an embodiment.

FIG. 3c is a bottom plan of the laminated microelectronic die 300 depicted in FIG. 3a according to an embodiment. The metal wiring interconnect layout 314 is depicted in phantom lines as it is obscured by the patterned BSL 322. As depicted, the three sectors 314a, 314b, and 314c are aligned to vertically correspond with the three patterned sectors 322a, 322b, and 322c, respectively, of the patterned BSL 322. In an embodiment, the patterned BSL 322 as depicted has a sculptured topology that is complementary to the metal wiring interconnect layout 314.

In an embodiment, the patterned BSL 322 has the rigidity equivalent of aluminum metal with a thickness of 10 μm such that during intended usage of the microelectronic die 311 heat generation therein is transferred to the metal wiring interconnect layout 314, and thermal expansion of the metal wiring interconnect layout 314 is countered by the presence of the patterned BSL 322 such that warpage of the microelectronic die 311 is less than 10 μm.

In any event, during intended usage of the microelectronic die 311 heat generation therein is transferred to the metal wiring interconnect layout 314, and thermal expansion of the metal wiring interconnect layout 314 is countered by the presence of the patterned BSL 322 such that warpage of the microelectronic die 311 is less than 10 μm.

FIG. 4a is a cross-section elevation of a laminated microelectronic die 400 that has been singulated from a wafer structure according to an example embodiment. The laminated microelectronic die 400 includes a thinned die 411. In an embodiment, the thinned die 411 has a thickness from 50 μm to 400 μm. The thinned die 411 includes a front-side metallization 416. The active surface 412 of the thinned die 411 is coupled to a metal wiring interconnect layer, one portion of which is depicted with reference numeral 414 according to the several disclosed embodiments depicted in FIGS. 1a-1e. The metal wiring interconnect layer 414 is complemented with a dummy wiring layout 415, which is depicted disposed against a thinned backside 420. As illustrated, the dummy wiring layout 415 is configured to be complementary to the metal wiring interconnect layout 414. In other words, the dummy wiring layout 415 is mirror-image patterned to match the metal wiring interconnect layer 414.

A BSL 422 is also disposed on the thinned backside 420 according to an embodiment. In an embodiment, the BSL 422 is about the same thickness as the dummy wiring layout 415, and the dummy wiring layout 415 is made of the same materials and the same thickness as the metal wiring interconnect layer 414.

In an embodiment, the BSL 422 is present without the dummy wiring layout 415 and is a single-phase material with a rigidity equivalent of aluminum metal with a thickness of 10 μm. In an embodiment, the BSL 422 is present without the dummy wiring layout 415 and is a multiple-phase material with fillers. In an embodiment, the fillers are homogeneously dispersed in the BSL 422. In an embodiment the fillers are filaments that are isotropically dispersed within the BSL 422. In an embodiment, the fillers are anisotropically aligned within the BSL and homogeneously dispersed. In an embodiment, the fillers are anisotropically aligned within the BSL 422 and clustered to simulate the effect the dummy wiring layout 415.

In an embodiment, the filler is a glass filament. In an embodiment, the filler is a carbon filament. In an embodiment, the filler is metal filament. In an embodiment, the filler is a ferromagnetic filament that has been homogenously aligned before curing the BSL 422. In lieu of filaments, substantially uniform aspect-ratio particles are used according to an embodiment. In an embodiment, two of the filler embodiments are present. In an embodiment, all three of the filler embodiments are present.

Figure 4B:
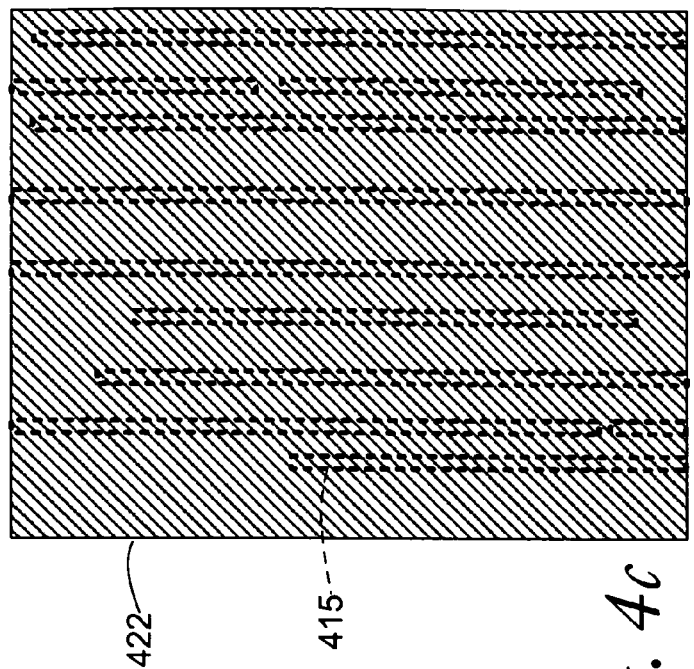

FIG. 4b is a top plan of the laminated microelectronic die 400 depicted in FIG. 4a. The metallization structure 416 is depicted with the metal wiring interconnect layout 414 disposed thereupon. In an embodiment, however, the metallization structure 416 may not be present and the metal wiring interconnect layout 414 is disposed directly upon the active surface 412.

Figure 4C:
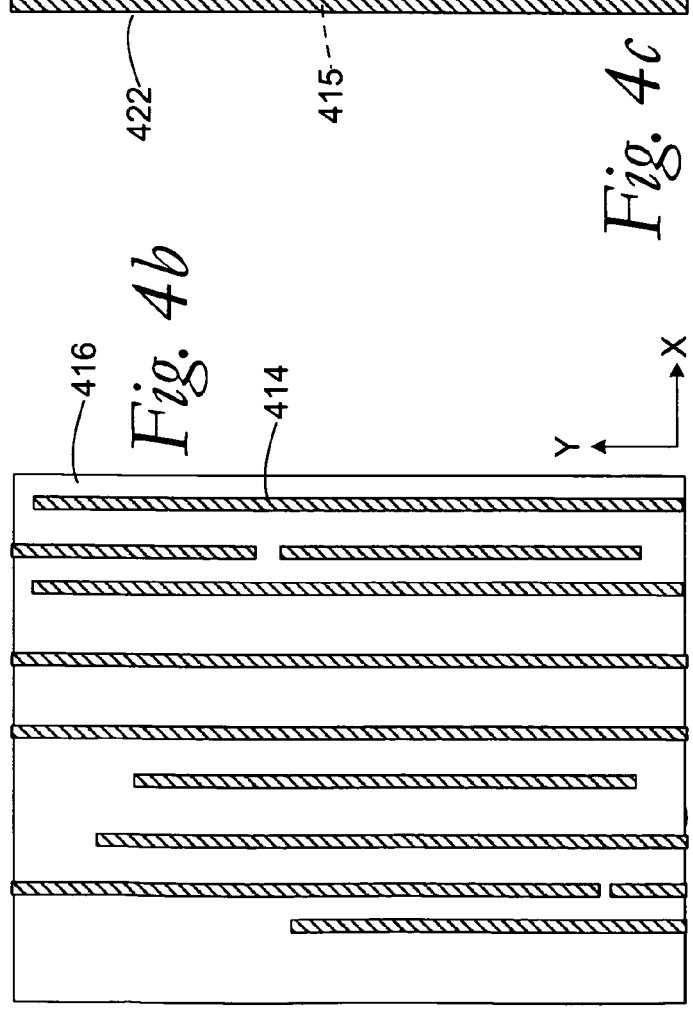
FIG. 4c is a bottom plan of the laminated microelectronic die depicted in FIG. 4a according to an embodiment.

FIG. 4c is a bottom plan of the laminated microelectronic die 400 depicted in FIG. 4a according to an embodiment. The dummy wiring layout 415 is depicted in phantom lines as it is obscured by the BSL 422. In an embodiment, the BSL 422 as depicted is combined with the dummy wiring layout 415 to have a complementary and antagonistic thermal expansion behavior to the metal wiring interconnect layout 414.

In an embodiment, the BSL 422 has the rigidity equivalent of aluminum metal with a thickness of 10 μm such that during intended usage of the microelectronic die 411 heat generation therein is transferred to the metal wiring interconnect layout 414, and thermal expansion of the metal wiring interconnect layout 414 is countered by the presence of the combination dummy wiring layout 415 and BSL 422 such that warpage of the microelectronic die 411 is less than 10 μm based upon a 1 cm-by-1 cm die standard.

In any event, during intended usage of the microelectronic die 411 heat generation therein is transferred to the metal wiring interconnect layout 414, and thermal expansion of the metal wiring interconnect layout 414 is countered by the presence of the dummy wiring layout 415 and BSL 422 such that warpage of the microelectronic die 411 is less than 10 μm.

FIG. 4c may also be used as a detail section taken from a small region of the entire BSL 422, such that what is used as the dummy wiring layout 415 may be understood to be anisotropic fibers that appear substantially homogenously dispersed. For example, FIG. 1c may be a 3 μm-by-4 μm detail section and the anisotropic fibers have a sub-micron thickness.

FIG. 5 is a cross-section elevation of a laminated microelectronic die 500 that has been singulated from a wafer structure according to an example embodiment. The laminated microelectronic die 500 includes a thinned die 511. In an embodiment, the thinned die 511 has a thickness from 50 μm to 400 μm. The thinned die 511 includes a front-side metallization 516. The active surface 512 of the thinned die 511 is coupled to a metal wiring interconnect layer, one portion of which is depicted with reference numeral 514 according to the several disclosed embodiments depicted in FIGS. 1a-1e. The metal wiring interconnect layer 514 is complemented with a dummy wiring layout 515, which is depicted disposed against a thinned backside 520. As illustrated, the dummy wiring layout 515 is configured to be vertically complementary to the metal wiring interconnect layout 514.

A patterned BSL 522 is also disposed on the thinned backside 520 according to an embodiment. In an embodiment, the patterned BSL 522 is about the same thickness as the dummy wiring layout 515. As illustrated, the patterned BSL 522 is patterned with conical-shaped depressions 524 that result in sectors. In an embodiment, the patterned BSL 522 is patterned as a first patterned sector 522a, a second patterned sector 522b, and a third patterned sector 522c, which vertically correspond to the first- second- and third layout sectors 514a, 514b, and 514c, respectively.

In an embodiment, the dummy wiring layout 515 is made of the same materials and the same thickness as the metal wiring interconnect layer 514. In an embodiment, the dummy wiring layout 515 is made of a material that has a higher coefficient of thermal expansion than the material of the metal wiring interconnect layer 514. One or both of the volume and structure of the dummy wiring layout 515 is lesser than the metal wiring interconnect layer 514 such that thermal expansion of one is complementary and antagonistic to the other.

In an embodiment, the patterned BSL 522 has the rigidity equivalent of aluminum metal with a thickness of 10 μm such that during intended usage of the microelectronic die 511 heat generation therein is transferred to the metal wiring interconnect layout 514, and thermal expansion of the metal wiring interconnect layout 514 is countered by the presence of the combination dummy wiring layout 515 and patterned BSL 522 such that warpage of the microelectronic die 511 is less than 10 μm.

In any event, during intended usage of the microelectronic die 511 heat generation therein is transferred to the metal wiring interconnect layout 514, and thermal expansion of the metal wiring interconnect layout 514 is countered by the presence of the dummy wiring layout 515 and patterned BSL 522 such that warpage of the microelectronic die 511 is less than 10 μm.

In an embodiment, the patterned BSL 522 is present without the dummy wiring layout 515 and is a single-phase, patterned material with a rigidity equivalent of aluminum metal with a thickness of 10 μm. In an embodiment, the patterned BSL 522 is present without the dummy wiring layout 515 and is a multiple-phase, patterned material with fillers. In an embodiment, the fillers are homogeneously dispersed in the BSL 522. In an embodiment, the fillers are anisotropically aligned within the patterned BSL 522 and homogeneously dispersed. In an embodiment, the fillers are anisotropically aligned within the patterned BSL 522 and clustered to simulate the effect the dummy wiring layout 515. In lieu of filaments, substantially uniform aspect-ratio particles are used according to an embodiment. In an embodiment, two of the disclosed filler embodiments are present. In an embodiment, all three of the filler embodiments are present.

FIG. 6 is a cross-section elevation of a computing device 600 according to an embodiment. A thinned die 611 includes a metal wiring interconnect layout 614 embodiment along with a patterned BSL 622 along with a dummy wiring layout 615. The thinned die 611 includes a front-side metallization 616. The active surface 612 of the thinned die 611 is coupled to a metal wiring interconnect layer, one portion of which is depicted with reference numeral 614. The metal wiring interconnect layer 614 is complemented with a dummy wiring layout 615, which is depicted disposed against a thinned backside 620. An external shell 650 provides support for the thinned die 611. In an embodiment, the external shell 650 is part of a wireless communicator such as a smart phone or a super-smart phone. A heat spreader 652 is coupled to the thinned die 611 through the patterned BSL 622.

In an embodiment, the patterned BSL 622 is present without the dummy wiring layout 615 and is a single-phase, patterned material with a rigidity equivalent of aluminum metal with a thickness of 10 μm. In an embodiment, the patterned BSL 622 is present without the dummy wiring layout 615 and is a multiple-phase, patterned material with fillers. In an embodiment, the fillers are homogeneously dispersed in the patterned BSL 622. In an embodiment, the fillers are anisotropically aligned within the patterned BSL 622 and homogeneously dispersed. In an embodiment, the fillers are anisotropically aligned within the patterned BSL 622 and clustered to simulate the effect the dummy wiring layout 615. In lieu of filaments, substantially uniform aspect-ratio particles are used according to an embodiment. In an embodiment, two of the disclosed filler embodiments are present. In an embodiment, all three of the filler embodiments are present.

Figure 7:
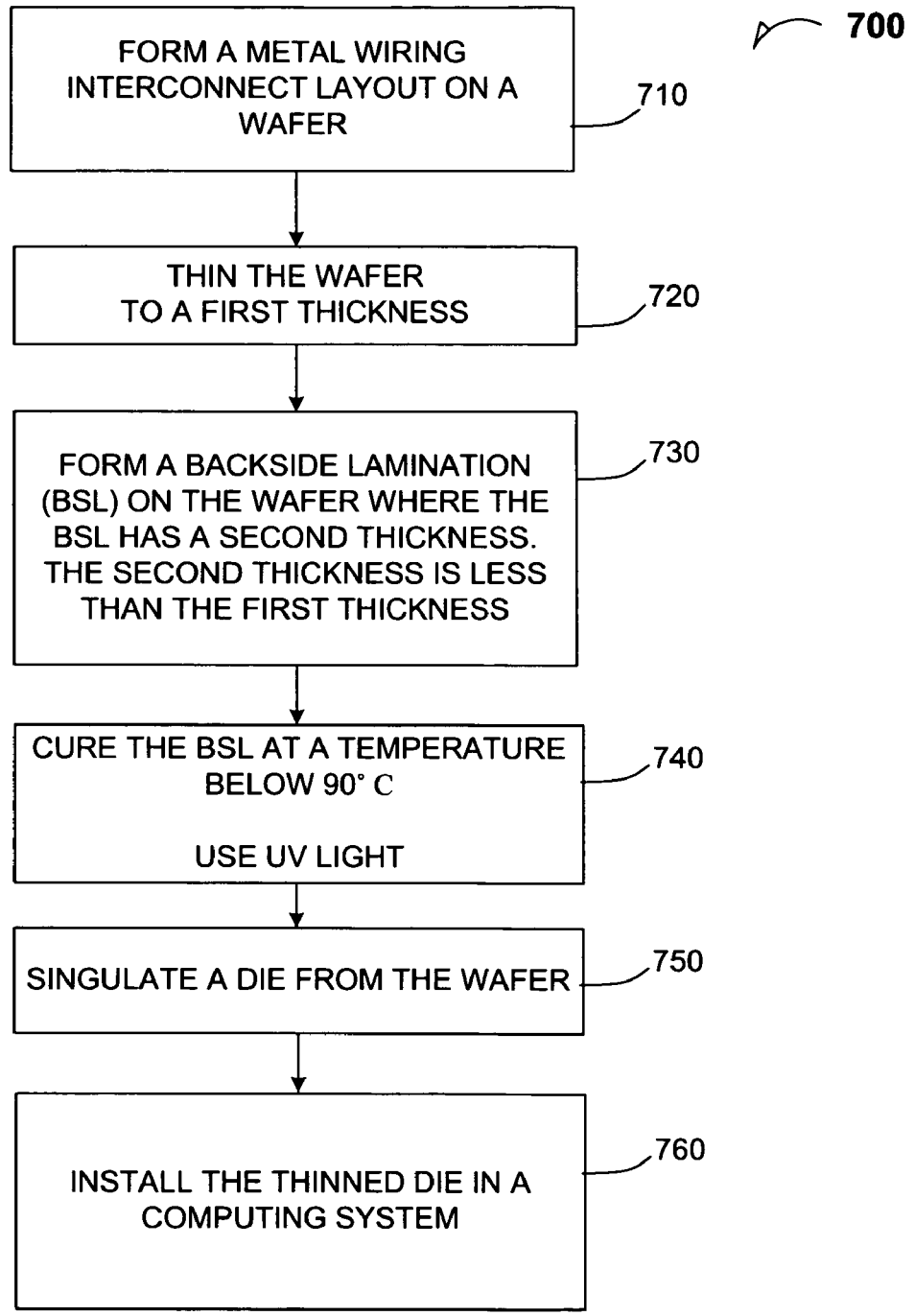
FIG. 7 is a process flow diagram according to selected embodiments.

FIG. 7 is a process flow diagram 700 according to selected embodiments.

At 710, the process includes forming a metal wiring interconnect layout on a wafer. In a non-limiting example embodiment, a metal wiring interconnect layout 114 is formed on the wafer 109 as depicted in FIG. 1a.

At 720, the wafer is thinned to a first thickness. In a non-limiting example embodiment, the wafer 109 as depicted in FIG. 1a is thinned by attaching the wafer 109 to grinding tape 118 and is thinned by backgrinding to a range from 50 μm to 200 μm to achieve the thinned wafer 110 depicted in FIG. 1c.

At 730, the process includes forming a backside lamination (BSL) on the thinned backside of the wafer. In a non-limiting example embodiment, a BSL 122 is formed on the thinned wafer 110. In a non-limiting example embodiment, a patterned BSL 222 is formed on the thinned wafer 210 as depicted in FIG. 2a. In a non-limiting example, a BSL 422 is formed on a thinned wafer and a dummy wiring layout 414 is formed along with the BSL 422.

At 740, the process includes curing the BSL at a temperature below 90° C. In a non-limiting example embodiment, the process includes curing the BSL at room temperature by use of ultraviolet (UV) light. In a non-limiting example embodiment, the BSL is cured under refrigeration conditions (meaning below room temperature) by use of UV light. One example embodiment material of the BSL includes polyimide material with curing agents that are UV reactive.

At 750, the process includes singulating a die from the wafer. The singulation process includes known tape, reel, and die-sort (TRDS) processing, applied to the BSL wafer embodiments set forth in this disclosure.

At 760, a method embodiment includes installing the thinned and BSL-processed die into a computing system. In a non-limiting example embodiment, the thinned die 611 with the metal wiring interconnect layout 614 coupled to the active surface and the BSL 622 coupled to the thinned back side is installed into a computing system such as a personal computer or a smart phone.

Figure 8:
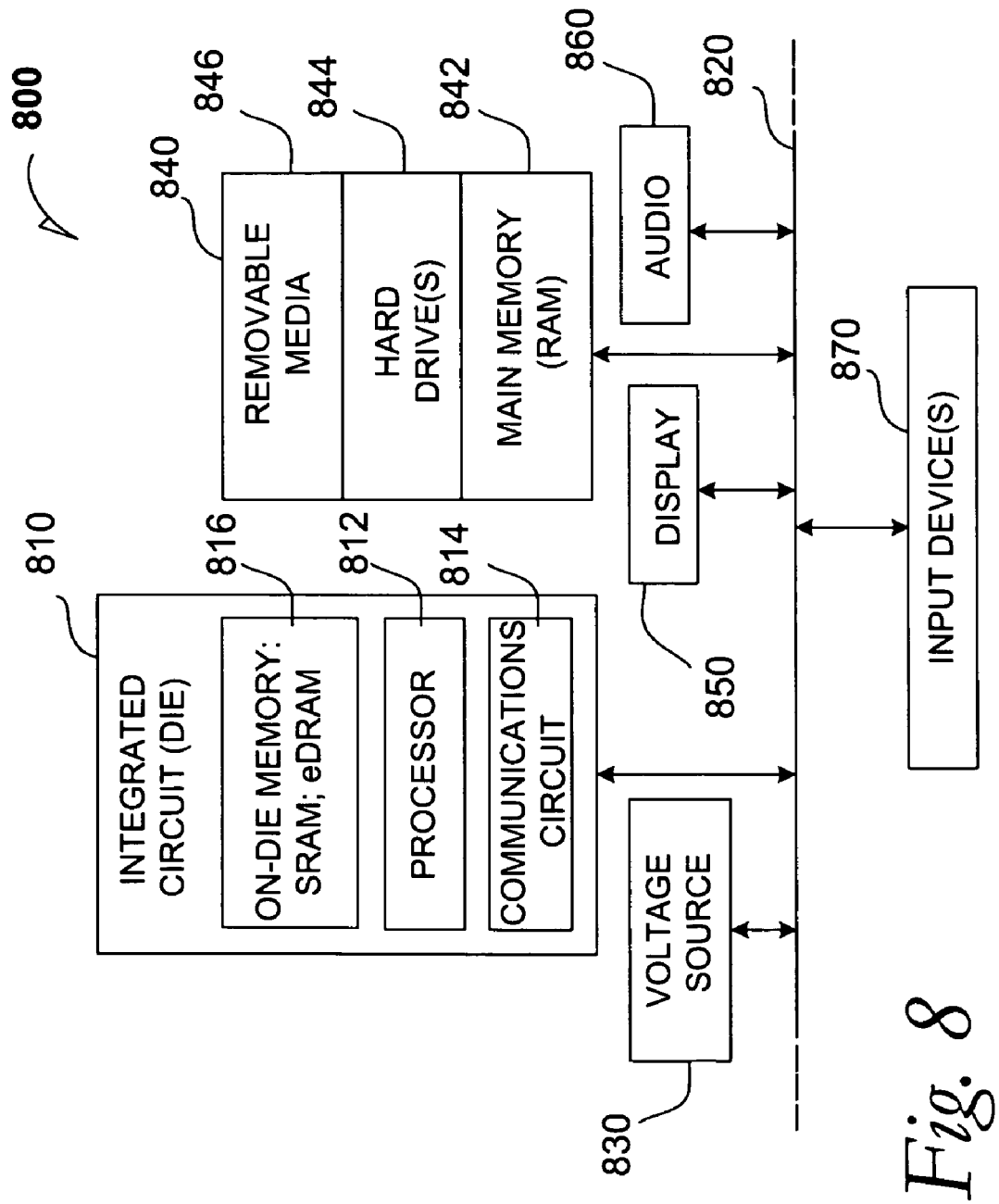
FIG. 8 is a schematic of an electronic system according to an embodiment.

FIG. 8 is a schematic of a computer system according to an embodiment.

The computer system 800 (also referred to as the electronic system 800) as depicted can embody a thinned die with a metal wiring interconnect layout embodiment and a BSL embodiment according to any of the several disclosed embodiments and their equivalents as set forth in this disclosure. In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones such as smart phones etc., pagers, portable computers, two-way radios, and similar electronic systems. In an embodiment, the processor 810 includes on-die memory 816 such as static random-access memory (SRAM) and the SRAM may include a 6T SRAM cell with independent S/D sections of the access and pull-down regions. In an embodiment, the processor 810 includes embedded on-die memory 816 such as embedded dynamic random-access memory (eDRAM).

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800.

As shown herein, the integrated circuit 810 can be implemented in a number of different embodiments, including a thinned die with a metal wiring interconnect layout embodiment and a BSL embodiment according to any of the several disclosed embodiments and their equivalents, an electronic system, a computer system, one or more methods of fabricating an integrated circuit, and one or more methods of fabricating a thinned die with a metal wiring interconnect layout embodiment and a BSL embodiment according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a thinned die with a metal wiring interconnect layout embodiment and a BSL embodiment according to any of the several disclosed embodiments and their equivalents.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:
1. An apparatus comprising:
a microelectronic die including a first thickness, wherein the die exhibits a thinned backside, an active surface;
a metal wiring interconnect layout disposed on the active surface, wherein the metal wiring interconnect layout has a metallic thickness from 5 micrometer (μm) to 15 μm; and
a back-side lamination (BSL) disposed on the thinned backside, wherein the BSL includes a second thickness that is less than the first thickness, and wherein the BSL resists warpage of the microelectronic die to less than 10 µm.

2. The apparatus of claim 1, wherein the microelectronic die first thickness is from greater than 50 µm to 400 µm, and wherein the BSL second thickness is in a range from 4 µm to 50 µm.

3. The apparatus of claim 1, wherein the microelectronic die first thickness is from greater than 50 µm to 400 µm, wherein the BSL second thickness is in a range from 4 µm to 50 µm;
wherein the active surface further includes between 1 and 8 levels of metallization wiring disposed between the metal wiring interconnect layout and the active surface.

4. The apparatus of claim 1, wherein the BSL resists warpage of the microelectronic die by less than 10 µm and wherein the BSL resists warpage due to passive rigidity of the BSL, and wherein the BSL includes a sculptured topology that is complementary to the metal wiring interconnect layout.

5. The apparatus of claim 1, wherein the BSL resists warpage of the microelectronic die, and wherein the BSL resists warpage due to a sculptured topology that is complementary to the metal wiring interconnect layout.

6. The apparatus of claim 1, wherein the BSL resists warpage of the microelectronic die due to rigidity that is counteractive to the metal wiring interconnect layout.

7. The apparatus of claim 1, wherein the BSL resists warpage of the microelectronic die due to rigidity that is counteractive to the metal wiring interconnect structure, wherein the BSL is patterned to counter thermal expansion of the metal wiring interconnect structure.

8. The apparatus of claim 1, wherein the BSL resists warpage of the microelectronic die wherein the BSL is mirror-image patterned counter to the metal wiring interconnect structure.

9. The apparatus of claim 1, wherein the BSL resists warpage of the microelectronic die due to rigidity that is counteractive to metal wiring interconnect structure, and wherein the BSL is mirror-image patterned counter to the metal wiring interconnect structure.

10. The apparatus of claim 1, wherein the BSL includes a filler.

11. The apparatus of claim 1, wherein the BSL includes a homogeneously dispersed filler.

12. The apparatus of claim 1, wherein the BSL includes an anisotropically aligned filler.

13. The apparatus of claim 1, wherein the BSL includes a homogeneously dispersed and anisotropically aligned filler.

14. An apparatus comprising:
a microelectronic die including a first thickness, wherein the die exhibits a thinned backside, an active surface;
a metal wiring interconnect layout disposed on the active surface; and
a dummy wiring layout disposed against the thinned backside, wherein the dummy wiring layout is configured to be complementary to the metal wiring interconnect layout, wherein the dummy wiring layout is mirror-image patterned to match the metal wiring interconnect layer, and wherein the dummy wiring layout is counter-active to the metal wiring interconnect layout under a heat load.

15. An apparatus comprising:
a microelectronic die including a first thickness, wherein the die exhibits a thinned backside, an active surface;
a metal wiring interconnect layout disposed on the active surface; and
a dummy wiring layout disposed against the thinned backside, wherein the dummy wiring layout is configured to be complementary to the metal wiring interconnect layout, the apparatus further including a patterned backside lamination that includes a sculptured topology that is complementary to the metal wiring interconnect layout.

16. The apparatus of claim 15, wherein the metal wiring interconnect layout includes at least a first layout sector, a second layout sector, and a third layout sector, the apparatus further including, wherein the patterned backside lamination is about the same thickness as the dummy wiring layout, and wherein the patterned backside lamination is patterned as a first patterned sector, a second patterned sector, and a third patterned sector, which vertically correspond to the first- second- and third layout sectors, respectively.

17. The apparatus of claim 15, wherein the patterned backside lamination includes a filler.

18. The apparatus of claim 15, wherein the patterned backside lamination includes a homogeneously dispersed filler.

19. The apparatus of claim 15 wherein the patterned backside lamination includes an anisotropically aligned filler.

20. The apparatus of claim 15, wherein the patterned backside lamination includes a homogeneously dispersed and anisotropically aligned filler.

21. An apparatus comprising:
a microelectronic die including a first thickness, wherein the die exhibits a thinned backside, an active surface;
a metal wiring interconnect layout disposed on the active surface; and
including a patterned backside lamination that includes a sculptured topology that is complementary to the metal wiring interconnect layout, wherein the metal wiring interconnect layout includes at least a first layout sector, a second layout sector, and a third layout sector, the apparatus further including a patterned backside lamination that is complementary to the metal wiring interconnect layout, wherein the patterned backside lamination is about the same thickness as the dummy wiring layout, and wherein the patterned backside lamination is patterned as a first patterned sector, a second patterned sector, and a third patterned sector, which vertically correspond to the first- second- and third layout sectors, respectively.

22. An apparatus comprising:
a microelectronic die including a first thickness, wherein the die exhibits a thinned backside, an active surface;
a metal wiring interconnect layout disposed on the active surface; and
including a patterned backside lamination that includes a sculptured topology that is complementary to the metal wiring interconnect layout, wherein the patterned backside lamination includes a sculptured topology.

23. An apparatus comprising:
a microelectronic die including a first thickness, wherein the die exhibits a thinned backside, an active surface;
a metal wiring interconnect layout disposed on the active surface; and
including a patterned backside lamination that includes a sculptured topology that is complementary to the metal wiring interconnect layout, wherein the patterned backside lamination includes a sculptured topology with at least one conical-shaped depression.

24. An apparatus comprising:
a microelectronic die including a first thickness, wherein the die exhibits a thinned backside, an active surface;
a metal wiring interconnect layout disposed on the active surface; and including a patterned backside lamination that includes a sculptured topology that is complementary to the metal wiring interconnect layout, wherein the patterned backside lamination includes a sculptured topology with at least one curve-shaped depression.

25. An apparatus comprising:
a microelectronic die including a first thickness, wherein the die exhibits a thinned backside, an active surface;
a metal wiring interconnect layout disposed on the active surface; and
including a patterned backside lamination that includes a sculptured topology that is complementary to the metal wiring interconnect layout, wherein the patterned backside lamination includes a filler.

26. An apparatus comprising:
a microelectronic die including a first thickness, wherein the die exhibits a thinned backside, an active surface;
a metal wiring interconnect layout disposed on the active surface; and
including a patterned backside lamination that includes a sculptured topology that is complementary to the metal wiring interconnect layout, wherein the patterned backside lamination includes a homogeneously dispersed filler.

27. An apparatus comprising:
a microelectronic die including a first thickness, wherein the die exhibits a thinned backside, an active surface;
a metal wiring interconnect layout disposed on the active surface; and
including a patterned backside lamination that includes a sculptured topology that is complementary to the metal wiring interconnect layout, wherein the patterned backside lamination includes an anisotropically aligned filler.

28. The apparatus of claim 27, wherein the patterned backside lamination includes a homogeneously dispersed filler.

* * * * *